United States Patent [19]

Nielsen

[11] Patent Number: 4,471,294

[45] Date of Patent: Sep. 11, 1984

[54] ELECTRICAL CONDUIT DEFECT LOCATION

[75] Inventor: Paul H. Nielsen, Mahomet, Ill.

[73] Assignee: The United States of America as represented by the Secretary of the Army, Washington, D.C.

[21] Appl. No.: 437,659

[22] Filed: Oct. 29, 1982

[51] Int. Cl.³ .............................................. G01R 31/08
[52] U.S. Cl. .................................... 324/52; 324/58 R
[58] Field of Search .......................... 333/12, 15, 245; 324/52, 51, 58 R

[56] References Cited

U.S. PATENT DOCUMENTS

| | | | |
|---|---|---|---|
| 2,860,304 | 11/1958 | Hall | 324/52 |
| 3,474,333 | 10/1969 | Hoel | 324/52 |
| 3,781,665 | 12/1973 | Gale | 324/52 |
| 3,792,350 | 2/1974 | Bossler et al. | 324/52 |
| 4,099,117 | 7/1978 | Erath | 324/54 |

FOREIGN PATENT DOCUMENTS 2210167 9/1973 Fed. Rep. of Germany ........ 324/52

Primary Examiner—Stanley T. Krawczewicz
Assistant Examiner—Jose M. Solis
Attorney, Agent, or Firm—Darrell E. Hollis

[57] ABSTRACT

A method and apparatus for locating defects in electrical conduits, hollow cables, or pipes above the ground, using a transmission line wherein one of the lines is the conduit under test. A high-frequency AC generator is used to feed the transmission line and set up a standing wave thereon. The transmission line is terminated in a short circuit at the wall of a shielded room. One conduit carries an internal conductor therein, the conductor and conduit forming another transmission line terminated by its characteristic impedance at both ends.

A field intensity meter is connected across the characteristic impedance within the shielded room. The location of the defect is determined by monitoring the magnitude of the induced signal on the conductor inside the conduit containing the defect as the applied frequency is increased from a predetermined low value to the frequency at which the first minimum occurs. A formula using this frequency is then employed to calculate the distance from one end of the transmission line to the defect location.

12 Claims, 7 Drawing Figures

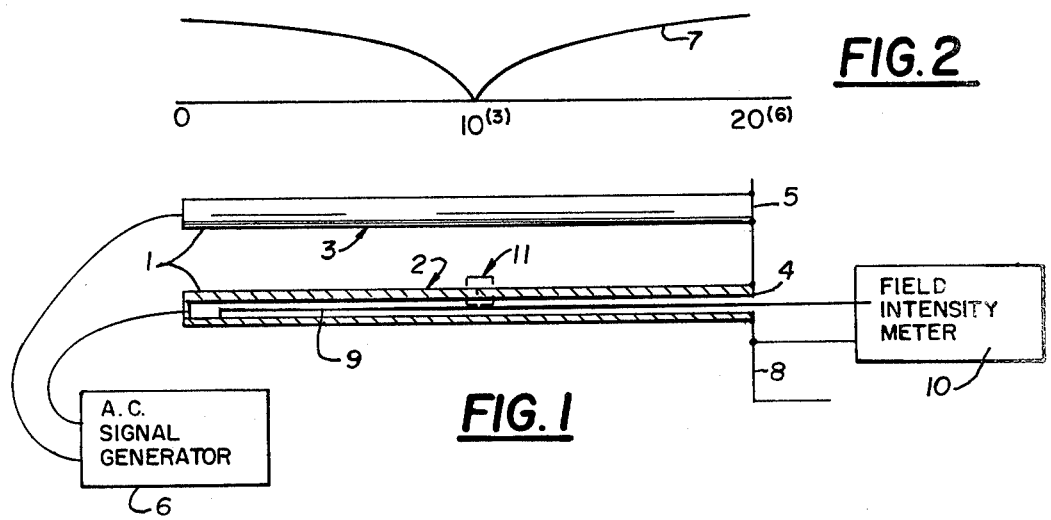
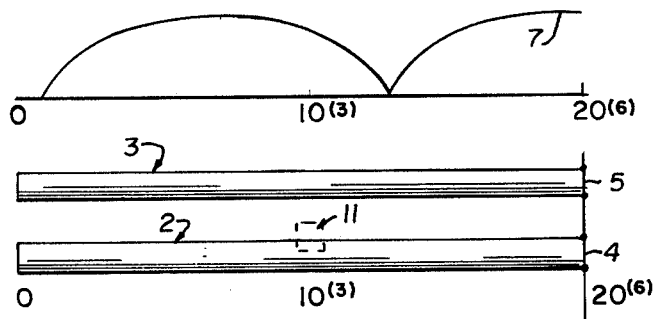
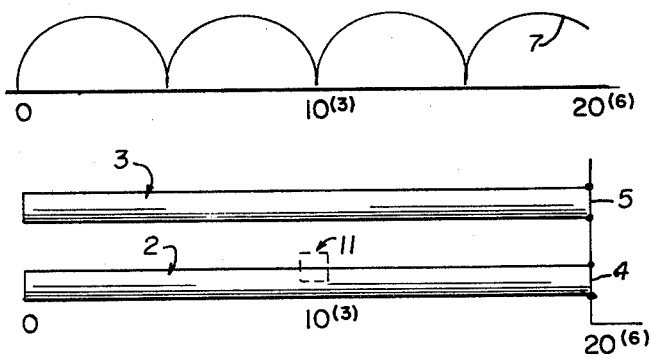

ELECTRICAL CONDUIT DEFECT LOCATION

STATEMENT OF GOVERNMENT INTEREST

The invention described and claimed herein may be manufactured and used by or for the Government of the United States of America for governmental purposes without the payment of royalties thereon or therefor.

BACKGROUND OF THE INVENTION

This invention relates to apparatus and procedures for the location of faults in a variety of conduits or hollow conductors located above the ground which are used to protect wiring and cabling routed through them.

Conduit-type shielding for electrical conductors is frequently employed to protect the conductors against the high-current levels expected from nuclear electromagnetic pulse (EMP) effects and from lightning strokes. If faults in the conduits occur, then the electromagnetic shielding or hardening of a facility against the high current levels will be significantly reduced. Regardless of the fault location method, it is always necessary to locate the physical location of the fault by measurements taken in a variety of manners. Auxiliary general-purpose equipment is used to convert the parameters of a cable or conduit fault to certain defined states.

Prior patents have used a variety of techniques to determine fault location varying from inductive pulse techniques to using alternating voltages. For example: U.S. Pat. No. 2,860,304, issued Nov. 11, 1958 to Hall, discloses a cable fault detector for determining fault location in electrical cables using an inductive pulse technique. U.S. Pat. No. 3,474,333, issued on Oct. 21, 1969 to Hoel, discloses a fault detector, using an alternating current system in which voltage drop is measured as a means for determining an inductance value for the system. U.S. Pat. No. 4,099,117, issued on July 4, 1978 to Erath, also discloses a fault detection technique using an alternating voltage. Electrodes are used to determine resistance values. U.S. Pat. No. 3,781,665 issued on Dec. 25, 1973 to Gale, discloses a fault detection system for coaxial cables. Alternating current, using an oscillator, is impressed across the system including the central conductor and the outer conduit. The fault is located as a function of the quarter-wavelength from the end of the cable to the fault. Input impedance is measured as a function of frequency to determine fault location. U.S. Pat. No. 3,792,350, issued on Feb. 12, 1974 to Bossler, is similar to the Gale patent previously mentioned and uses probes.

In general, the prior art detects a "major impedance change" or fault in a coaxial system by a reflection from that impedance change. A "major impedance change" means a short circuit between the center conductor and outer conductor or an open circuit in one of the conductors.

However, electrical currents large enough to disrupt sensitive electronic equipment operation or cause damage to such electronics can be coupled from current flowing on the external surface of conduits to wires inside the conduit if such conduits contain electrical discontinuities or defects even though such defects are not classified as "major impedance changes". Large external currents can result from lightning or electromagnetic pulse (EMP) effects. Apparently, no satisfactory technique exists for determining the quality and locating non-major defects of an electrical conduit system.

SUMMARY OF THE INVENTION

The present invention provides an apparatus and method which is intended to discover defects, in conduits, of a type which do not cause a significant or major impedance change in the conduit coaxial system; for example, partial breaks and slits in a conduit, or rusty conduit couplings.

A pair of conduits are viewed as a transmission line and are terminated in a short circuit by connecting the ends of the conduits to a wall (electrically conductive) of a shielded room. An internal conductor is placed inside each conduit. Each conductor and its associated conduit forms a transmission line and each such transmission line is terminated in its characteristic impedance at both ends.

A high-frequency AC generator, and amplifier if necessary, is connected to feed the transmission line formed by the two conduits and a field intensity meter connected to the other shielded-room end of one of the conduit-conductor (c-c) lines to read the voltage so as to check for a defect on the c-c line.

The AC voltage is applied to the conduit-pair line at a predetermined low frequency which is gradually increased. When the field intensity meter registers its first minimum reading, the associated input frequency of the AC generator is used in the equation $d=300/4f_1$, where $f_1$ is the determined frequency in MHZ and d is the distance of the defect to the shorted end of the conduit in meters.

If only a single conduit is being examined for a defect, a second conduit or electrical wire of the same length can be used to form a transmission line with the conduit to be examined.

Accordingly, the following are objects of this invention:

to provide a system which discovers defects, in a conduit-transmission-line system, of a type which do not cause a significant impedance change, such as partial breaks, slits, and rusty couplings;

to provide a relatively sensitive technique for locating in conduit-transmission-line systems the types of flaws causing electromagnetic pulse (EMP) leakage; and to achieve the foregoing objects with a minimum of specialized equipment and with simple technical procedures.

This invention and its further objects, features and advantages will be readily discerned from a reading of the detailed description in conjunction with the following figures in the drawing.

BRIEF DESCRIPTION OF THE DRAWING

FIG. 1 is an illustration showing the concept of the invention in connection with a two-conduit transmission line wherein one conduit has a defect.

FIG. 2 represents a current standing wave on the two shorted circuits of FIG. 1, the wave being induced by an excitation frequency of 23 MHz.

FIG. 3 illustrates the current standing-wave form, observable on a shorted, two-conduit transmission line, such as that shown in FIG. 1, induced by an excitation frequency of 31 MHz.

FIG. 4 is an illustration of a shorted, two-conduit transmission line, such as that shown in FIG. 1, with a current-standing-wave form induced by an excitation frequency of 75 MHz.

DESCRIPTION OF THE PREFERRED EMBODIMENTS

Figure 5:
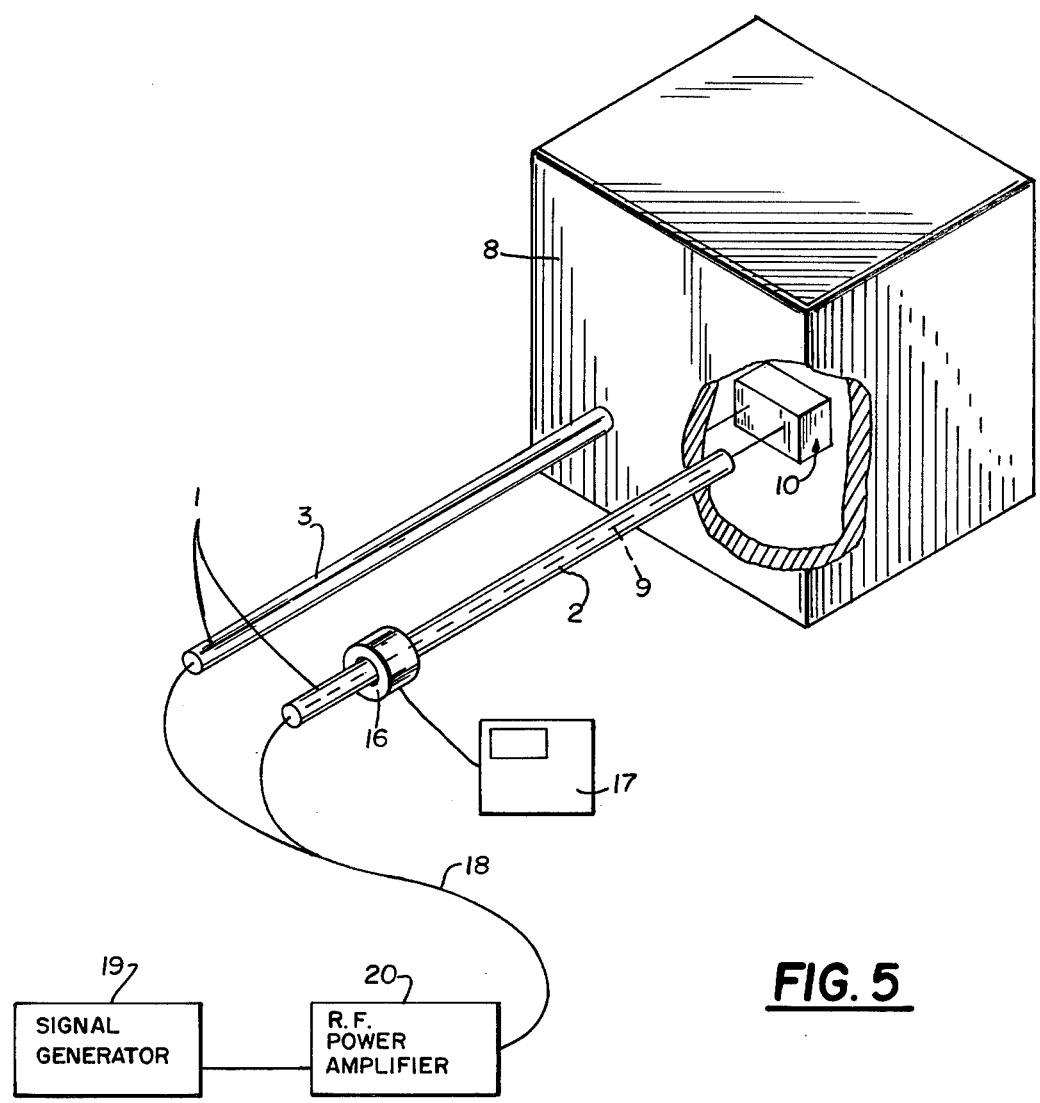
FIG. 5 is an isometric view of one arrangement of an electrical apparatus for locating a fault in an electrical conduit by means of standing waves.

In the following description, the invention is described as including two conduits 2, 3. Note, however, that the invention may be used to discover defects in systems having only one conduit. In this case, conduit 3 may be an electrical conductor, such as a single wire, paralleling and of the same length as conduit 2.

If a transmission line 1 made up of two metallic conduits 2,3, as shown in FIGS. 1, 3, 4, terminates in a short circuit 4, 5 on a shielded room 8 and is excited with an alternating current source 6 as shown in FIG. 1, standing waves 7 shown in FIGS. 2, 3, 4 will be present on the transmission line 1. This means that current peaks and nodes exist along the length of the conduit lines 2, 3 as shown at FIGS. 2, 3, 4. (Of course, a current peak always occurs at the location of the short 4, 5.) These peaks and nodes will occur at different locations on the transmission line 1 with different excitation frequencies f1, f2, f3, fn . . . as shown at FIGS. 2, 3, 4 and these locations can be accurately determined; hence, allowing a test for locating conduit defects.

Figure 7:
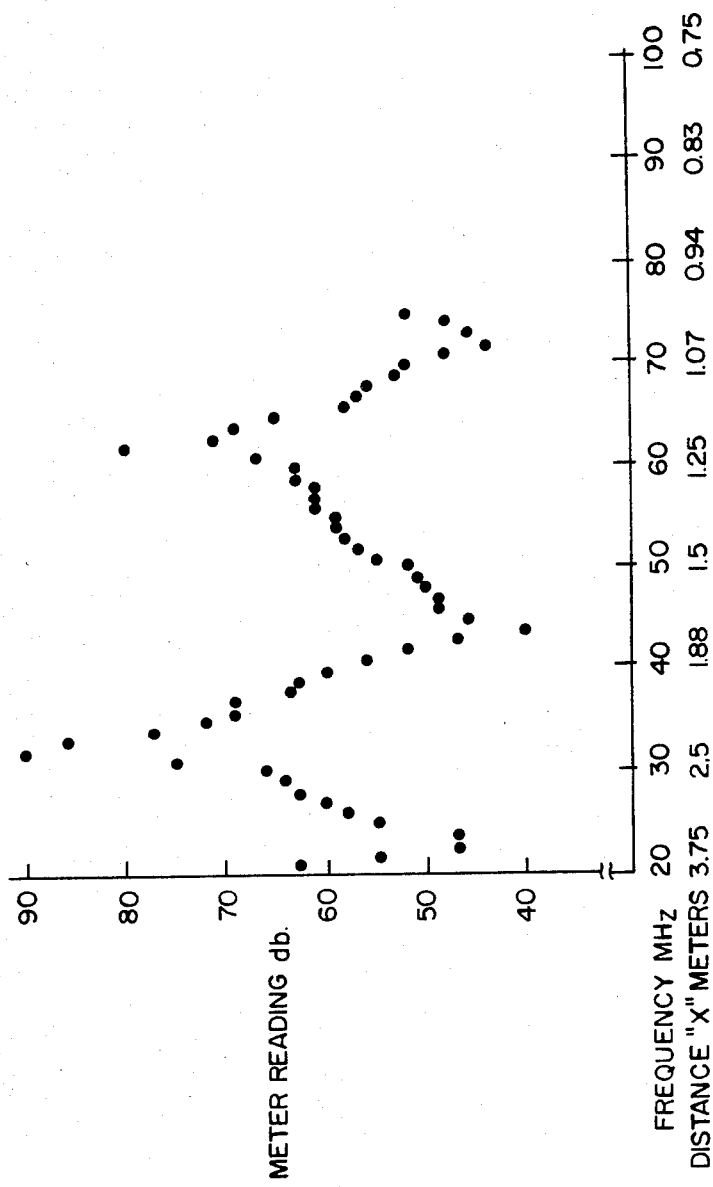
FIG. 7 is a graph of current standing-wave output vs. excitation frequency for a defect ten feet (3 meters) from the signal source end. The graph also shows the correlation of the standing-wave output with the location of the defect from the shorted end of the transmission line.

A conductor 9 inside conduit 2 with the defect 11 will be excited by the standing wave 7. By monitoring the signal level on the conductor 9 with Field Intensity Meter 10 as the applied frequency is varied, a plot of voltage amplitude on conductor 9 versus the frequency may be obtained. Such a plot is shown in FIG. 7. The location of the defect 11 in the conduit 2 can then be determined by obtaining from the plot the lowest frequency at which a minimum occurs. Additional minima will occur at multiples of the lowest frequency.

Figure 6:
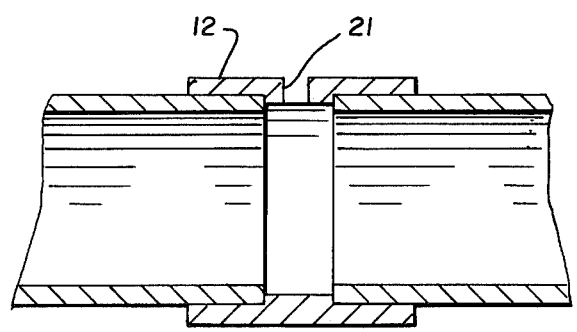
FIG. 6 is a cross-sectional view of the coupling of two conduit tubes wherein the coupling has a fault.

FIG. 5 now shows an embodiment according to the invention for determining the position of a fault affecting a conductor 9 and, in particular, determining the exact distance of the conduit fault from a particular location. FIG. 5 depicts a parallel conduit transmission line 1 consisting of two, one-half-inch, steel, electrical metallic tubing (EMT) conduits 2, 3, each 20 feet long, for example, and spaced two inches apart. The 20-foot length was obtained by using two standard 10-foot sections of conduit connected with a standard electrical metallic tubing (EMT) coupling 12 as shown at FIG. 6. The conduits 2, 3 are terminated in the wall of shielded room 8 which short-circuits the conduits to each other. A twelve-gauge copper wire 9 is connected through a resistor to conduit 2 near the end where the AC signal on the conduits is coupled to conduit 2. This resistor is equal to the characteristic impedance of the transmission line formed by conduit 2 and wire 9. The wire 9 extends through conduit 2 and terminates at field intensity meter 10 located within shielded room 8. Preferably, field intensity meter 10 is a tuned voltmeter having the capability of being tuned to monitor the voltage amplitude of an AC signal at a specific frequency. However, other types of voltmeters may be used to obtain accurate results. Defects can be located by exciting the conduit transmission line 1 at various frequencies, keeping constant the magnitude of the maximum conduit current, and monitoring the signal level appearing at the wire 9 within the conduit.

The standing-wave pattern on the conduit transmission line 1 is observed by monitoring the output of a current probe 16 placed around the conduit 2 using an oscilloscope 17 as the probe 16 is moved from one end of conduit 2 to the other. The output of the current probe 16 positioned on conduit 2 is plotted as a function of location and as a function of signal amplitude. FIG. 2 depicts the current standing wave for a frequency of 23 MHZ. FIG. 3 depicts the current standing wave for a frequency of 31 MHZ. FIG. 4 is the current standing wave for a frequency of 75 MHZ. Observation of this standing wave pattern is not necessary for location of defects as the location of peaks and nodes can be theoretically determined.

The current probe 16, in the practice of this invention, is positioned at the shorted end of the transmission line and used with the oscilloscope 17 as a means for observing the maximum current on the transmission line. Accordingly, by observing the maximum current, the output of the signal generator 19 and the power amplifier 20 is adjusted to maintain a constant maximum amplitude value as the frequency is varied. Of course, other means may be provided to ensure that transmission line 1 is excited by a constant amplitude signal over the pertinent frequency range as are well known by persons having ordinary skill in the art.

If a defect exists on the test conduit 2, the magnitude of a signal measured on the internal conductor 9 will vary dependent upon the excitation frequency 18. The excitation frequency 18 provided by a signal generator 19 and RF power amplifier 20 determines the magnitude of the standing wave at the point of the defect. Thus, a plot of the magnitude of the signal appearing on the internal conductor 9 versus frequency can be used to determine the location of defects.

Using the test set up at FIG. 5, the data in FIG. 7 is plotted with the current probe 16 still placed on the conduit 2 at the end where it is connected to the shielded room 8, so as to monitor the standing-wave magnitude across the conduit pair 2, 3 in order to keep the magnitude constant at the shorted end. FIG. 7 plots the magnitude of the signal induced on conductor 9 versus the frequency of the AC signal from signal generator 19 for a defect (a perforation 21 cut through coupling 12) 10 feet (3 m) from the shorted end 4, 5 of the conduit-pair transmission line. The internal conductor 9 is terminated in its characteristic impedance so that no standing wave is present thereon. However, the voltage induced in the internal conductor 9 is proportional to the value of the standing wave at the fault 11 in conduit 2. Since the standing-wave value at the defect varies as the wave moves along the conduits in accordance with changing input frequency, the value of voltage on the internal conductor 9, as measured by the field intensity meter 10, varies.

The location of a defect can be determined by noting the lowest frequency at which a minimum occurs, as measured by the intensity meter 10. From FIG. 7, this would occur at a frequency of 23 MHZ. The distance, $d_1$, in meters from the shorted end 4 of the conduit transmission line 1 is then:

$$d_1 = 300/4f_1 \qquad (1)$$

where $f_1$ is the frequency in MHZ at which the minimum occurs. By calculation, $d_1$ would be equal to 3 meters which can also be confirmed by examining FIG. 2.

One can now correlate the defect 11, comprising a perforation 21 cut through a coupling 12 as shown in FIG. 6, ten feet from the signal source. For example, at 23 MHZ on FIG. 2 a current minimum is shown at 10 feet, or 3 meters (3 m), from the shorted end of the conduits. Corresponding to the 23 MHZ frequency setting, a minimal reading of some 47 dB is noted on FIG. 7. Likewise, at a frequency of approximately 31 MHZ with a 90 dB voltage maximum on FIG. 7, one can correlate the fault with FIG. 3 where the fault is located just over 10 feet from the shorted end of the conduits.

Ambiguities can exist at multiple frequencies of the lowest frequency, $f_1$, at which the minimum occurs. In other words, the minimums could result from the defect at $d_1$ or at locations $$d_2 = 300/4f_2,\ d_3 = 300/4f_3,\ \ldots\ d_n = 300/4f_n \qquad (2)$$

where $f_n = 2f_1,\ 3f_1 \ldots nf_1$
and $n = 1, 2, 3 \ldots$

However, existence of minimums at frequencies other than multiples of $f_1$ indicates additional flaws whose location can be determined by $$d_x = 300/4f_x \qquad (3)$$

hence this embodiment can be used to locate multiple defects.

The lowest frequency of interest, the frequency at which the test is started, is $$f_0 = 300/4L \qquad (4)$$

where L is the length of the conduit transmission line in meters. Thus, for a 20-meter line, $f_0 = 3.70$ MHZ.

An alternate method for locating the defect can be used by adding another scale to the amplitude versus frequency graph of FIG. 7. FIG. 7 shows such a scale where distance, x, from the shorted end 4, 5 is plotted in meters below the frequency scale.

Distance, x, from the shorted end of the conduit to the defect can be projected and plotted in accordance with the equation $$x = 300/4f_x \qquad (5)$$

For a field test system, the location of the standing wave peaks and minimums can be theoretically derived by noting that the wavelength of the standing waves at FIGS. 2, 3, 4 is approximately equal to the free-space wavelength where:

$$\text{wavelength in meters} = 3 \times 10^5 \div \text{frequency } (H_z) \qquad (6)$$

The current embodiment appears relatively sensitive and will locate all types of flaws causing electromagnetic pulse leakage. The standing wave test would probably not be feasible for buried conduit since any transmission line in a conducting medium, such as soil, will be quite lossy.

Obviously, many modifications and variations of the present invention are possible in light of the above teachings. It is therefore to be understood that, within the scope of the appended claims, the invention may be practiced otherwise than as specifically described.

What is claimed is:

1. A method of locating a fault in an electrical conduit comprising the steps of:
    providing a transmission line including a test conduit and an external conductor;
    providing an internal conductor within said test conduit;
    terminating said internal conductor in an impedance substantially equal to the characteristic impedance of said internal conductor and said conduit;
    generating a plurality of electromagnetic standing-wave-pattern signals on said transmission line;
    monitoring said internal conductor for electrical signals induced thereon; and
    calculating from said monitored signals the location of the fault.

2. The method of claim 1 wherein the step of generating a plurality of electromagnetic standing-wave-pattern signals includes:
    applying an alternating current signal to said transmission line; and
    varying the frequency of said alternating current over a frequency range.

3. A method as in claim 1, wherein:
    said standing-wave signals are gradually increased in frequency from a lowest frequency of $f_0 = 300/4L$ where $f_0$ is in MHZ and L is the length of said conduit in meters.

4. A method as in claim 3, wherein:
    the lowest frequency at which the signal induced on the inner conductor is determined by said monitoring and is used in the formula given below to determine the fault location, the formula being $$d = 300/4f_1$$

where $f_1$ is said lowest determined frequency in MHZ and d is the distance in meters of the fault from the shorted end of the shorted TL.

5. A method as in claim 4, wherein:
    the determination of more than one minimum signal value at frequencies $f_{x1}, f_{x2}, \ldots$ other than multiples of the frequency $f_1$ previously found indicate other conduit faults whose locations can be found by substituting the other frequency values in the formula:

$$d_n = 300/4f_{xn}$$

6. A method for locating a defect in a conduit capable of carrying electrical current comprising the steps of:
    paralleling the conduit with an external conductor of equal length;
    paralleling the conduit with an inner conductor;
    connecting a terminating impedance between said inner conductor and said conduit at both ends of the inner conductor, the impedance being equal in value to the characteristic impedance of the inner conductor and said conduit;
    short-circuiting the conduit and the external conductor at one end thereof;
    applying a high-frequency AC signal to the non-shorted end of the second conductor and gradually increasing the frequency thereof;

metering the value of the signal appearing at the end of the inner conductor opposite the end of the external conductor at which the electrical current is applied and noting the frequency at which the firs minimum value appears;

calculating the location of the conduit defect from the formula:

$$d = 300/4f$$

in which f is the frequency in MHZ at which the first minimum was found and d is the distance in meters of the defect from the shorted end of the conduit.

7. A method as in claim 6, wherein the lowest frequency of interest is determined from the formula:

$$f_0 = 400/4L \text{ (in MHZ)}$$

where L is the length of the external conductor in meters.

8. An apparatus for locating a fault in an electrical test conduit, comprising:
 a. a test conduit;
 b. an internal conductor located within said test conduit;
 c. an external conductor located outside said test conduit;
 d. said external conductor and said conduit being grounded at one end thereof and said internal conductor being terminated at both ends in an impedance substantially equal to the characteristic impedance of said test conduit and said internal conductor;
 e. means for applying at one end of the external conductor a variable frequency signal; and
 f. signal detection means connected to the internal conductor for measuring the value of the signal induced thereon.

9. Apparatus, for locating a fault in an electrical conduit as recited in claim 8, wherein:
 the means for applying a variable frequency to the external conductor include a signal generator and RF power amplifier;
 the first signal detecting means include an oscilloscope;
 the second signal detecting means include a voltmeter.

10. The method of claim 2 wherein the step of calculating includes:
 determining the lowest frequency of said alternating current signal at which a minimum amplitude is observed on said internal conductor.

11. The method of claim 10 wherein the step of determining further includes determining the distance (d) from said shorted end of said transmission line to the defect by using the equation $$d = 300/4f$$

where f is said lowest frequency.

12. The apparatus of claim 8 further comprising signal detecting means coupled to said conduit to indicate the magnitude of the standing waves in said conduit.

* * * * *